United States Patent [19]
Jäckle

[11] 3,981,139
[45] Sept. 21, 1976

[54] SELF CONTAINED BATTERY OPERATED CLOCK FABRICATED ON A SINGLE PRINTED CIRCUIT BOARD

[75] Inventor: Reinhard Jäckle, St. Georgen, Germany

[73] Assignee: Gebruder Staiger, Fabrik fur Feinmechanik und Elektrotechnik — Kunststoffspritzerei, St. Georgen, Germany

[22] Filed: Jan. 20, 1975

[21] Appl. No.: 542,240

[30] Foreign Application Priority Data
Jan. 24, 1974  Germany.......................... 2403289

[52] U.S. Cl. .............................. 58/23 R; 58/19 R; 58/23 BA
[51] Int. Cl.².......................................... G04C 3/00
[58] Field of Search ............... 58/19 R, 38 R, 23 R, 58/23 BA; 317/101 C; 340/392; 29/626, 625

[56] References Cited
UNITED STATES PATENTS

| | | | |
|---|---|---|---|
| 2,599,710 | 6/1952 | Hathaway ............................. | 29/625 |
| 3,339,117 | 8/1967 | Fisher ............................. | 317/101 C |
| 3,375,423 | 3/1968 | Mayer et al. ........................ | 58/23 R |
| 3,509,715 | 5/1970 | DeKoster ............................ | 58/23 R |
| 3,583,148 | 6/1971 | Wolber .............................. | 58/23 BA |
| 3,583,149 | 6/1971 | Ganter .............................. | 58/19 R |
| 3,712,044 | 1/1973 | Wolber et al. ....................... | 58/23 R |
| 3,757,510 | 9/1973 | Dill ................................. | 58/23 R |
| 3,838,568 | 10/1974 | Zurcher et al. ................ | 58/23 R X |

*Primary Examiner*—Ulysses Weldon
*Attorney, Agent, or Firm*—Mason, Kolehmainen, Rathburn & Wyss

[57] ABSTRACT

A battery operated quartz crystal controlled alarm clock includes a single printed circuit board having a quartz crystal controlled oscillator and an oscillator controlled drive circuit mounted directly on the single printed circuit board. Additional components as for example a time display unit, an alarm signal source, a disconnect switch for the alarm signal source and one or more batteries are all arranged directly on the same circuit board with direct electrical contact being established between the components and the conductive areas plated on the circuit board. The release spring of an electro-mechanical movement is mounted on the conductor side of the circuit board and serves to establish electrical contact between two conductive areas of the circuit board to complete an electrical circuit for energizing the alarm signal source. The movement is mounted on the opposite side of the printed circuit board and communicates with the release spring through an aperture formed in the printed circuit board. All of the electrical connections are designed to substantially reduce the number of connecting members and the number of soldering operations required to produce the clock.

7 Claims, 6 Drawing Figures

SELF CONTAINED BATTERY OPERATED CLOCK FABRICATED ON A SINGLE PRINTED CIRCUIT BOARD

BACKGROUND OF THE INVENTION

1. Field of the Invention

This invention relates generally to electric clocks, and more particularly, to battery operated, quartz crystal controlled alarm clocks having a drive or control circuit controlled by an oscillator wherein the clock circuitry is located on a single one-piece printed circuit board carrying additional components such as a time display unit, an electro-mechanical movement for driving the display unit, an alarm signal source, a disconnect switch for the alarm signal source and one or more batteries or the like.

2. Brief Description of the Prior Art

Quartz controlled battery operated clocks utilizing a one-piece printed circuit board carrying a quartz crystal controlled oscillator and an oscillator controlled drive circuit comprising frequency divider stages and an amplifier for amplifying the drive impulses generated by the divider stages are known. Such clocks generally employ an electro-mechanical drive mechanism (or movement) driving a mechanical or electronic time display unit and being actuated by the drive impulses. A battery feeding the drive circuit, the circuit board, and the electro-mechanical drive mechanism or movement are generally accommodated in a plastic housing, and connecting cables as well as sheet metal lugs riveted to the circuit board are utilized to establish the electrical connection between the battery (or batteries) and the circuitry located on the circuit board, and between the circuit board circuitry and the electro-mechanical drive mechanism or movement.

Because of the competitive nature of the clock industry, clock manufacturers must produce large numbers of units in a cost-saving manner. Unfortunately, the production costs are increased by the use of individual parts such as the sheet metal lugs, and by the additional soldering operations necessitated by the used of connecting cables.

In an effort to reduce production costs, battery operated and quartz controlled clocks having quartz oscillators and drive circuits located on a one-piece circuit board have utilized a pluggable connection to connect a liquid crystal display unit to the circuit board. However, such clocks still employ additional connecting members for connecting the battery to the circuit board.

SUMMARY OF THE INVENTION

It is an object of the present invention to provide an improved electrically operated clock that eliminates the disadvantages of the prior art clocks.

Another object of the present invention is to provide a low cost battery operated quartz crystal controlled clock.

Yet another object of the present invention is to provide an electric clock with an actuating and control circuit arranged on a one-piece circuit board as compactly as possible and in such a manner that electrical connecting members in the form of sheet metal strips, connecting cables and the like be avoided as completely as possible.

Still another object of the present invention is to minimize the number of soldering operations required in the production of a battery operated electric clock.

In accordance with a preferred embodiment of the invention, an electric clock, particularly a battery operated quartz controlled alarm clock, having an actuating or control circuit controlled by an oscillator whose frequency is determined by a quartz or other time keeping element is fabricated on a one-piece circuit board. Additional components such as a time display unit, a display unit drive mechanism, an alarm signal source, a disconnect switch for the alarm signal source and one or more batteries or the like are all arranged directly on the same circuit board. Direct electrical contact is established between the connecting points of these components and the conductive areas of the circuit board. As a result, an electric clock constructed according to the invention can be manufactured more simply and at a lower cost, and the danger of functional failure thus caused by improperly soldered joints is substantially reduced.

Other electrical assemblies besides those already described may be connected to the circuit board by special connecting members, such as interconnecting cables, if desired to provide additional functions or features. As previously mentioned, the time display unit may be either mechanical or electrical. For purposes of this discussion, electrical indicator units shall include all time indicating assemblies which do not have a mechanical wheel mechanism, for example, fully electronic digital indicators such as liquid crystal or luminous diode indicators, and electronic analog indicators.

The components may be connected individually or in groups directly to the circuit board, or the components may be held above the circuit board in such a manner that electrical contact between the components and the conductive areas of the circuit board is established either directly or through contact with other components that are fastened directly to the circuit board.

The battery (or batteries) used for energizing the clock are placed with one terminal directly on a conductive area of the circuit board and supported in contact therewith by part of the housing. The housing may include biasing apparatus for maintaining the battery (or batteries) in contact with the circuit board, and may also include an electrical bridge for connecting another one of the battery terminals to the circuit board and for interconnecting the various batteries when multiple batteries are used. As a result, the sheet metal lugs utilized in prior art systems may be eliminated.

When an electro-mechanical drive mechanism or movement is placed according to the invention directly on the circuit board, the electrical connecting members which are present on such drive mechanisms can be connected directly to electrically conductive parts of the circuit board, for example, at contact pins of the drive mechanism inserted into the circuit board. However, the basic idea of the invention can also be realized by utilizing contact surfaces, provided at the electromagnetic drive mechanism which come into direct contact with electrically conductive areas of the circuit board when the drive mechanism is mounted on the circuit board. Thus, in a preferred embodiment of the invention, a drive mechanism of the electromechanical type is mounted directly on the circuit board and connected directly and without connecting cables to the conductors of the circuit board.

In alarm clocks with a mechanical hand indicator mechanism, it is customary to provide a release spring for the alarm signal source. This release spring cooperates with the hour wheel of the indicator mechanism, which hour wheel upon reaching the set alarm time is axially shifted under the influence of the release spring. If the electromechanical drive mechanism, which includes a mechanical indicator mechanism, is mounted directly on the circuit board, the circuit of the alarm signal source can be opened and closed in a simple manner if the release spring is located on the conductor side of the circuit board and forms part of an electrical contact set consisting of two printed circuit conductors and the release spring. Thus, separate contact members coacting with the release spring in the conventional manner can be avoided. Adding additional conductors to the printed circuit board for coacting with the release spring, does not materially increase the cost of the circuit board.

The electric clock is provided with an alarm signal source in the form of an electric buzzer with at least one coil. In accordance with the basic idea of the invention, not only the drive circuit for the alarm signal source is mounted on the circuit board, but the alarm signal source itself is also mounted directly on the circuit board. In a preferred embodiment, the ends (or leads) of the coil winding or windings are guided directly to conductive areas of the circuit board preferably provided by fingers, or the like, formed at the edge of the circuit board. The leads of the coil are wound about such fingers and then, during the dip-soldering of the circuit board, the leads are simultaneously soldered to these fingers. Thus, no special interconnecting cables are needed between the circuit board and the alarm signal source. The design of such a clock becomes particularly compact when the core of the buzzer coil is fastened directly to the circuit board, particularly when it is riveted in place.

The conductors on the circuit board are also usable as electric switch contacts for disconnecting the alarm signal source from the battery. An adjustable conductor is located adjacent to the circuit board for selectively connecting together two conductors of the circuit board to provide the switching action. The adjustable conductor can be carried, for example, by the printed circuit board itself and can be guided thereby, but it is also possible to utilize another part of the clock to carry and guide the adjustable conductor in such a manner that it remains biased against the printed circuit board.

Other objects and advantages of the present invention will be readily apparent from the following detailed description and drawings, wherein.

Figure 1:
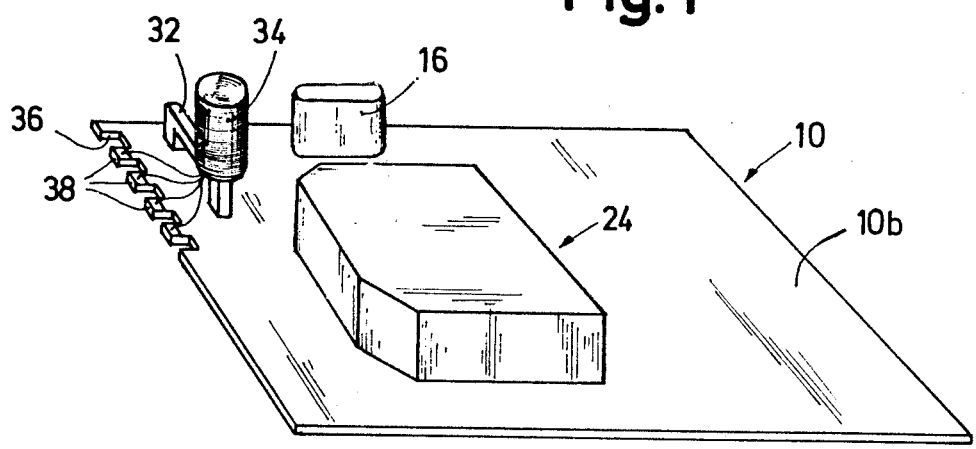
FIG. 1 is a graphic representation of the printed circuit board of a battery operated quartz controlled alarm clock viewed from the rear.
Figure 2:
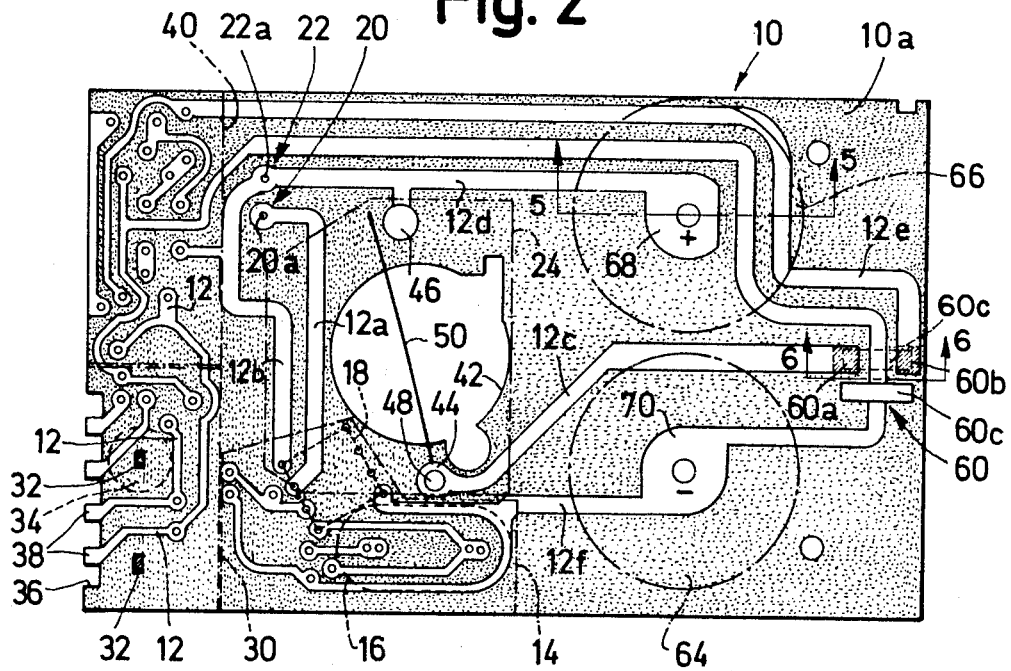
FIG. 2 is a top view of the printed circuit board of FIG. 1 as viewed from the front.

The drawings are schematized as far as possible; thus, FIGS. 1 and 2 only show a few assemblies or modules as components because the majority of the equipment of the printed circuit board has been omitted for reasons of clarity.

Referring to FIG. 2, numerous conductors are located on the front side 10a of a printed circuit board 10. The conductors are conventional and shall not be described in detail, and only some of them are identified with the reference numeral 12 in an overall manner. The conductors 12 interconnect different components or modules, whose circuit elements which are arranged on the reverse side 10b of the printed circuit board 10 and which, for the most part, are not shown in FIG. 1 as they are conventional circuits. Some of the conductors 12 are also part of the electrical circuits of these modules. However, certain areas are outlined in FIG. 2 by dots and dashes, and these areas comprise the following circuits:

Reference numeral 14 identifies the area of an indicator actuating or drive circuit, controlled by a quartz crystal located in a housing 16. Hereinafter, for the sake of simplicity, the symbol 16 shall be used for the quartz crystal. The actuating circuit 14 also contains an electric oscillator circuit (not shown in detail) for energizing the quartz crystal 16, as well as several frequency divider stages and an amplifier (also not shown in detail). The major part of the actuating circuit 14 is formed by an integrated circuit 18, whose chip is placed on the reverse side 10b of the printed circuit board and shown in broken lines in FIG. 2. Two conductor paths 12a and 12b lead from the actuating circuit 14 to two connecting points 20 and 22 of an electro-mechanical drive mechanism or movement 24, which is shown schematically as a box in FIG. 1 and by dashed lines in FIG. 2. The electro-mechanical drive mechanism or converter 24 of the preferred embodiment also includes a mechanical clockwork for driving hands indicating the time (not shown). In the preferred embodiment of the clock according to the invention, when a mechanical indicator is utilized, the drive mechanism 24 is provided with an oscillating coil (not shown) as the converter, for moving the mechanical indicator step by step. Such electro-mechanical drive mechanisms are known (see for instance U.S. Pat. No. 3,472,020). Electrical contact to the converter member is provided by contact pins (not shown) connected to the oscillating coil of the drive mechanism via springs. In a preferred embodiment, the pins are inserted into holes 20a and 22a at the connecting points 20 and 22 of the circuit board 10.

An area 30 defines another module located on the printed circuit board 10, namely an alarm signal source including an electric buzzer. The electric buzzer comprises a U-shaped core 32 and a control and driving coil 34. The electric buzzer is placed on the reverse side 10b of the printed circuit board and the U-shaped core 32 is riveted to the circuit board in this embodiment, but other fastening schemes may be used. To avoid having to solder separate connecting cables for making electrical connection to the leads of winding 34, four of the conductors 12 of the printed circuit board are provided leading to four fingers 38 formed at the edge of the printed circuit board by cut-outs 36. The connecting ends or leads of the winding 34 are coiled and soldered to the ends of the conductors 12 leading to the fingers 38 when the printed circuit board is immersed in molten solder during the dip-soldering process utilized to solder the other components to the circuit board.

The buzzer 30 is connected to a repeat circuit defined by an area 40. Such repeat circuits are conventional, and serve to interrupt the signal of the buzzer 30, usually periodically, so that the actual alarm signal is repeated.

Figure 4:
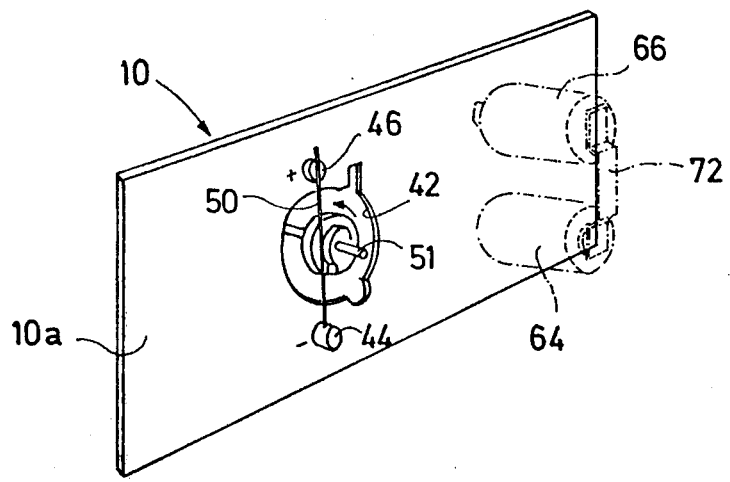
FIG. 4 is a graphic representation of the printed circuit board viewed from the front, showing the hour wheel shaft in cooperation with the release spring.

An aperture 42 is provided in the central area of the printed circuit board 10. The aperture 42 is disposed between two contact points 44 and 46 of two conductor paths 12c and 12d, and a hole 48 is formed in the center of the contact point 44. The contact points 44 and 46, in conjunction with a release spring 50 (shown schematically), form an electrical contact for closing the circuit of the buzzer 30. Biased release springs which are controlled by the hour wheel of a mechanical indicator mechanism as contained in the drive mechanism 24 and which close the circuit of an electric buzzer are known from prior art. However, in accordance with an important aspect of the invention, as shown in FIG. 4 the shaft 51 of the hour wheel (not shown) of the drive mechanism 24 extends through the aperture 42 of the printed circuit board 12 for actuating the release spring 50. In the preferred embodiment, the release spring 50 is fastened by a screw (not shown) which passes through the hole 48 and holds one end of the release spring 50 against the printed circuit board 10. The release spring 10 thereby serves as a contact member with one end in electrical contact with the contact point 44 and the other end of the release spring 50 making contact with the contact point 46 when it is not lifted by the hour wheel from this contact point. Moreover, the drive mechanism 24 can be fastened to the circuit board 10 by the same screw that is used to fasten the release spring 50.

Figure 6:
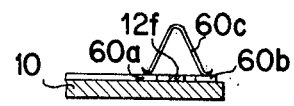
FIG. 6 is a partial sectional view of the printed circuit board taken along lines 6—6 of FIG. 2.

A switch, identified as a unit by the reference numeral 60 is placed between one end of the conductor 12c and one end of a conductor 12e for manual disconnection of the buzzer 30. The switch 60 includes the hatched ends 60a and 60b of the conductors 12c and 12e and a resilient contact bow 60c. The contact bow 60c is connected (in a manner not shown) to a handle (not shown) and guided displaceably in the direction of the hatched ends 60a and 60b to provide a conductive path therebetween. The contact bow 60c is resiliently biased against the front side 10a of the printed circuit board 10 so that it can interconnect the conductor ends 60a and 60b (shown in FIG. 6 and in dashed lines in FIG. 2), or to open the switch 60 when moved to the position shown in solid lines in FIG. 2.

Figure 5:
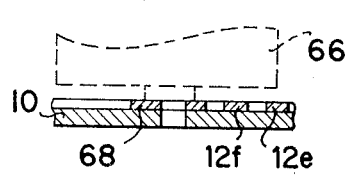
FIG. 5 is a partial cross sectional view of the printed circuit board taken along lines 5—5 of FIG. 2.
Figure 3:
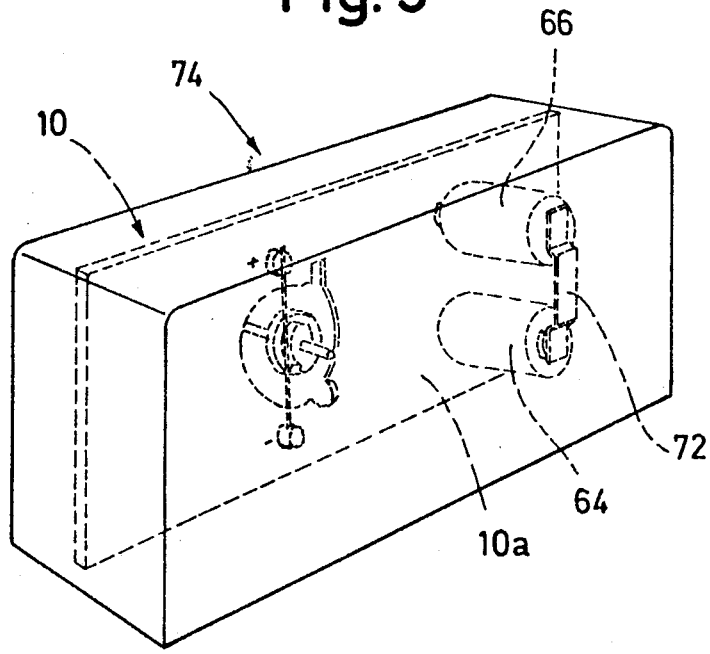
FIG. 3 is a graphic representation of a housing for the movement of the alarm clock as viewed from the rear.

Finally, the reference numerals 64 and 66 identify two cylindrical batteries, which are placed vertically on the front side 10a of the printed circuit board 10. One of the batteries 66 is seated with its positive terminal directly on a widened area 68 of the conductor 12d, (FIG. 5) while the other battery 64 is seated with its negative terminal on a widened area 70 of a conductor 12f. Both batteries, preferably, are pressed against the conductors 12d and 12f by the housing 74, (FIG. 3) accommodating the printed circuit board 10. This housing appropriately has a sheet metal strip 72 or the like inserted therein for interconnecting the other terminals of the batteries 64 and 66. If a single battery is used, the housing may have a conductive strip for connecting the other terminal of the single battery to a conductive area of the circuit board 10.

While certain preferred embodiments of the invention have been described by way of illustration, many modifications will occur to those skilled in the art; it will be understood, of course, that it is not desired that the invention be limited thereto, since modifications may be made, and it is, therefore, contemplated by the appended claims to cover any such modifications as fall within the true scope and spirit of the invention.

What is claimed as new and desired to be secured by Letters Patent of the United States is:

1. In an electric clock having a printed circuit board with a plurality of conductive areas plated thereon for interconnecting an electromechanical movement mounted on the printed circuit board with a group of modules and for interconnecting the modules, each module having at least one electric terminal, said group comprising a quartz controlled electric oscillator, a drive circuit controlled by the oscillator, an alarm signal source, an alarm release switch operated by the movement for closing the circuit of said alarm signal source, contacts of a manually operated alarm stop switch for breaking said circuit and a battery also having terminals, each of said modules and said battery being arranged on said printed circuit board with at least one of said terminals of each module and battery being in direct contact with selected ones of said conductive areas, with said alarm stop switch comprising a manually operated conductive member slidably contacting said printed circuit board, said conductive member being movable to a first position in direct contact with two of said conductive areas and to a second position out of contact with said areas for selectively electrically connecting and disconnecting said two conductive areas.

2. A clock as recited in claim 1 wherein said electromechanical movement is provided with a terminal mounted in direct contact with one of said conductive areas.

3. A clock as recited in claim 1 wherein said alarm release switch comprises a contact spring mounted on said printed circuit board opposite said electromechanical movement and wherein said electromechanical movement has an actuating element extending therefrom, said contact spring being adapted to contact one of said conductive areas for closing the alarm release switch, said contact spring extending over an opening defined in said printed circuit board for receiving said actuating element to permit the electromechanical movement to control the alarm release switch.

4. A clock as recited in claim 1 wherein said alarm signal source includes an electric buzzer having at least one coil having a pair of leads being directly affixed to conductive areas of said circuit board.

5. A clock as recited in claim 4 wherein a plurality of fingers having conductive areas thereon are formed on an edge of said printed circuit board, each of said leads being affixed to one of said conductive areas of said fingers.

6. A clock as recited in claim 4 wherein said buzzer includes a core mechanically fastened directly to the printed circuit board.

7. In an electric clock having a printed circuit board with a plurality of conductive areas plated thereon for interconnecting an electromechanical movement mounted on the printed circuit board with a group of modules and for interconnecting the modules, each module having at least one electric terminal, said group comprising a quartz controlled electric oscillator, a drive circuit controlled by the oscillator, an alarm signal source, an alarm release switch operated by the movement for closing the circuit of said alarm signal source, contacts of a manually operated alarm stop switch for breaking said circuit and a battery also having terminals, each of said modules and said battery being arranged on said printed circuit board with at least one of said terminals of each module and battery being in direct contact with selected ones of said conductive areas, with said alarm stop switch having first and second terminals and being arranged on said printed circuit board with said terminals being in direct contact with two of said conductive areas for selectively electrically connecting and disconnecting said two conductive areas.

* * * * *